(12) United States Patent
Nam

(10) Patent No.: US 10,003,012 B2
(45) Date of Patent: Jun. 19, 2018

(54) ELECTRONIC DEVICE AND METHOD FOR FABRICATING THE SAME

(71) Applicant: SK hynix Inc., Icheon-Si (KR)

(72) Inventor: Ki-Won Nam, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days. days.

(21) Appl. No.: 15/481,297

(22) Filed: Apr. 6, 2017

(65) Prior Publication Data

US 2018/0040808 A1 Feb. 8, 2018

(30) Foreign Application Priority Data

Aug. 8, 2016 (KR) .................. 10-2016-0100861

(51) Int. Cl.
| | | |
|---|---|---|
| *G11C 11/00* | (2006.01) | |
| *H01L 43/02* | (2006.01) | |
| *H01L 43/08* | (2006.01) | |
| *H01L 43/10* | (2006.01) | |
| *H01L 43/12* | (2006.01) | |
| *G11C 11/16* | (2006.01) | |
| *G06F 1/32* | (2006.01) | |
| *G06F 13/42* | (2006.01) | |

(52) U.S. Cl.
CPC ............ *H01L 43/02* (2013.01); *G06F 1/3275* (2013.01); *G06F 1/3287* (2013.01); *G06F 1/3296* (2013.01); *G06F 13/4282* (2013.01); *G11C 11/1675* (2013.01); *H01L 43/08* (2013.01); *H01L 43/10* (2013.01); *H01L 43/12* (2013.01)

(58) Field of Classification Search
CPC .. G06F 1/3275; G06F 1/3296; G06F 13/4282; G11C 11/1675; H01L 43/08; H01L 43/10; H01L 43/12
See application file for complete search history.

(56) References Cited

U.S. PATENT DOCUMENTS

| | | | | |
|---|---|---|---|---|
| 7,755,934 B2 * | 7/2010 | Toda | ......................... | G11C 8/08 |
| | | | | 365/131 |
| 8,013,711 B2 * | 9/2011 | Wei | ........................ | H01L 27/101 |
| | | | | 257/2 |
| 8,305,795 B2 * | 11/2012 | Azuma | ............... | G11C 13/0007 |
| | | | | 365/148 |
| 8,861,257 B2 * | 10/2014 | Hayakawa | ............ | H01L 27/101 |
| | | | | 365/100 |
| 9,136,463 B2 | 9/2015 | Li et al. | | |

* cited by examiner

*Primary Examiner* — Pho M Luu
(74) *Attorney, Agent, or Firm* — Perkins Coie LLP

(57) ABSTRACT

This technology provides an electronic device and a method for fabricating the same. An electronic device in accordance with an implementation of this document may include a semiconductor memory, wherein the semiconductor memory may include: a variable resistance element disposed over a substrate and structured to exhibit different resistance states for storing data; and an upper contact plug disposed over the variable resistance element and coupled to the variable resistance element, wherein the upper contact plug includes a first portion that is disposed between an upper end of the upper contact plug and a lower end of the upper contact plug and the first portion has a width smaller than a width of each of the upper end and the lower end.

20 Claims, 13 Drawing Sheets

ELECTRONIC DEVICE AND METHOD FOR FABRICATING THE SAME

CROSS-REFERENCE TO RELATED APPLICATIONS

This patent document claims priority of Korean Patent Application No. 10-2016-0100861, entitled "ELECTRONIC DEVICE AND METHOD FOR FABRICATING THE SAME" and filed on Aug. 8, 2016, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device and a method for fabricating the same, in which an electronic device includes a semiconductor memory which can improve characteristics of a variable resistance element.

In an implementation, an electronic device includes: a semiconductor memory, wherein the semiconductor memory may include: a variable resistance element disposed over a substrate and structured to exhibit different resistance states for storing data; and an upper contact plug disposed over the variable resistance element and coupled to the variable resistance element, wherein the upper contact plug includes a first portion that is disposed between an upper end of the upper contact plug and a lower end of the upper contact plug and the first portion has a width smaller than a width of each of the upper end and the lower end.

Implementations of the above device may include one or more the following.

The upper contact plug has a wine glass-like shape. The upper contact plug includes an upper portion sidewall that is not aligned with a sidewall of the variable resistance element, and a lower portion sidewall that is aligned with the sidewall of the variable resistance element. The upper contact plug includes an upper portion that decreases in width in a direction towards the variable resistance element. The variable resistance element comprises, a Magnetic Tunnel Junction (MTJ) structure including a free layer having a changeable magnetization direction, a pinned layer having a fixed magnetization direction and a tunnel barrier layer interposed between the free layer and the pinned layer, and a capping layer disposed over the MTJ structure and including a metal. The upper contact plug comes in direct contact with the capping layer. The variable resistance element further comprises a magnetic correction layer that is disposed between the MTJ structure and the capping layer and offsets or reduces an influence of a stray field generated by the pinned layer. The semiconductor memory further comprises a hard mask pattern that is disposed over the lower portion of the upper contact plug and has an inner sidewall surrounding the first portion of the upper contact plug and an outer sidewall aligned with the sidewall of the variable resistance element. The hard mask pattern includes a metal or metal oxide. The variable resistance element comprises a lower portion and an upper portion that is disposed over the lower portion and has a width narrower than that of the lower portion, and the semiconductor memory further comprises a protective layer pattern disposed on a sidewall of the upper portion of the variable resistance element. The upper contact plug has a lower portion having a sidewall aligned with the sidewall of the upper portion of the variable resistance element. The upper contact plug has a lower portion having a sidewall surrounded by the protective layer pattern. The variable resistance element comprises, a Magnetic Tunnel Junction (MTJ) structure including a free layer having a changeable magnetization direction, a pinned layer having a fixed magnetization direction and a tunnel barrier layer interposed between the free layer and the pinned layer, and a magnetic correction layer that is disposed over the MTJ structure and offsets or reduces an influence of a stray field generated by the pinned layer, wherein the upper portion of the variable resistance element comprises a portion of the magnetic correction layer, all of the magnetic correction layer, all of the magnetic correction layer and a portion of the MTJ structure, or all of the magnetic correction layer and all of the MTJ structure. The variable resistance element comprises a lower portion and an upper portion that is disposed over the lower portion and has a width narrower than that of the lower portion, and the semiconductor memory further comprises a protective layer pattern that is disposed on sidewalls of the upper portion of the variable resistance element, sidewalls of the lower portion of the upper contact plug and outer sidewalls of the hard mask pattern. A lower portion of the upper contact plug has sidewalls that are aligned with the upper portion of the variable resistance element.

In another implementation, an electronic device includes: a semiconductor memory, wherein the semiconductor memory may include: a variable resistance element structured to exhibit different resistance states for storing data and disposed over a substrate; and an upper contact plug disposed over the variable resistance element and coupled to the variable resistance element, wherein the upper contact plug has a first portion with a first shape and a second portion formed under the first portion with a second shape different from the first shape.

Implementations of the above device may include one or more the following.

The first portion has a decreasing width along a direction perpendicular to a surface of the substrate and a gradient of a sidewall of the first portion is higher than that of a sidewall of the second portion. The first portion of the upper contact plug has a sidewall not aligned with a sidewall of the variable resistance element, and the second portion of the upper contact plug has a sidewall aligned with the sidewall of the variable resistance element. The variable resistance element comprises, a Magnetic Tunnel Junction (MTJ) structure including a free layer having a changeable magnetization direction, a pinned layer having a fixed magnetization direction a tunnel barrier layer interposed between the free layer and the pinned layer, and a capping layer disposed over the MTJ structure and including a metal. The upper contact plug comes in direct contact with the capping layer. The variable resistance element further comprises a magnetic correction layer that is disposed between the MTJ structure and the capping layer and offsets or reduces an influence on a stray field generated by the pinned layer. The semiconductor memory further comprises a hard mask pattern surrounding a sidewall of an area in the first portion of the upper contact plug, the area having a minimum width of the upper contact plug. The hard mask pattern comprises a metal or metal oxide. The variable resistance element comprises a lower portion having a first width, and an upper portion disposed over the lower portion and having a second width smaller than the first width. The semiconductor memory further comprises a protective layer pattern disposed on a sidewall of the upper portion of the variable resistance element. The second portion of the upper contact plug has a sidewall aligned with the sidewall of the upper portion of the variable resistance element. The sidewall of the second portion of the upper contact plug is surrounded by the protective layer pattern. The variable resistance element comprises, a Magnetic Tunnel Junction (MTJ) structure including a free layer having a changeable magnetization direction, a pinned layer having a fixed magnetization direction a tunnel barrier layer interposed between the free layer and the pinned layer; and a magnetic correction layer that is disposed over the MTJ structure and offsets or reduces an influence on a stray field generated by the pinned layer, wherein the upper portion of the variable resistance element comprises a portion of the magnetic correction layer, all of the magnetic correction layer, all of the magnetic correction layer and a portion of the MTJ structure, or all of the magnetic correction layer and all of the MTJ structure. The variable resistance element comprises a lower portion, and an upper portion disposed over the lower portion and having a width narrower than that of the lower portion, and the semiconductor memory further comprises a protective layer pattern that is disposed on sidewalls of the upper surface of the variable resistance element, sidewalls of the upper contact plug in the second region and outer sidewalls of the hard mask pattern. In the second region, sidewalls of the upper contact plug are aligned with the upper portion of the variable resistance element.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another implementation, a method for fabricating an electronic device including a semiconductor memory may include: forming material layers over a substrate to provide a variable resistance element; forming a sacrificial layer over the material layers; forming a hard mask pattern over the sacrificial layer; etching the sacrificial layer and the material layers using the hard mask pattern as an etch barrier to provide a stacked structure including the etched sacrificial layer and the etched material layers; forming an insulating material covering the stacked structure; selectively etching the insulating material to provide a first space exposing the etched sacrificial layer; removing the etched sacrificial layer to provide a second space; and forming a contact plug by filling the first space and the second space.

Implementations of the above method may include one or more the following.

The sacrificial layer comprises a carbon-containing material. The removing of the etched sacrificial layer includes performing an oxygen strip process on the etched sacrificial layer. The variable resistance element comprise a metal, and the method further comprises, after the removing of the etched sacrificial layer, performing an additional etch process in order to remove oxide of the metal formed over the variable resistance element. The additional etch process is performed by using an inert gas. A portion of the hard mask pattern is maintained over the etched sacrificial layer in the etching of the sacrificial layer and the material layers and the portion of the hard mask pattern is exposed in the selectively etching of the insulating material; and the method further comprising: removing the exposed portion of the hard mask pattern. The etching of the sacrificial layer and the material layers includes, performing a first etching on the sacrificial layer and a portion of the material layers by using the hard mask pattern as an etch barrier; forming a protective layer pattern on a sidewall of the firstly etched portion; and performing a second etching on a remaining portion of the material layers by using the protective layer pattern and the hard mask pattern as an etch barrier. The forming of the material layers comprises, forming a Magnetic Tunnel Junction (MTJ) structure including a free layer having a changeable magnetization direction, a pinned layer having a fixed magnetization direction and a tunnel barrier layer interposed between the free layer and the pinned layer; and forming a capping layer including a metal over the MTJ structure.

These and other aspects, implementations and associated advantages are described in greater detail in the drawings, the description and the claims.

DETAILED DESCRIPTION

Figure 1A:
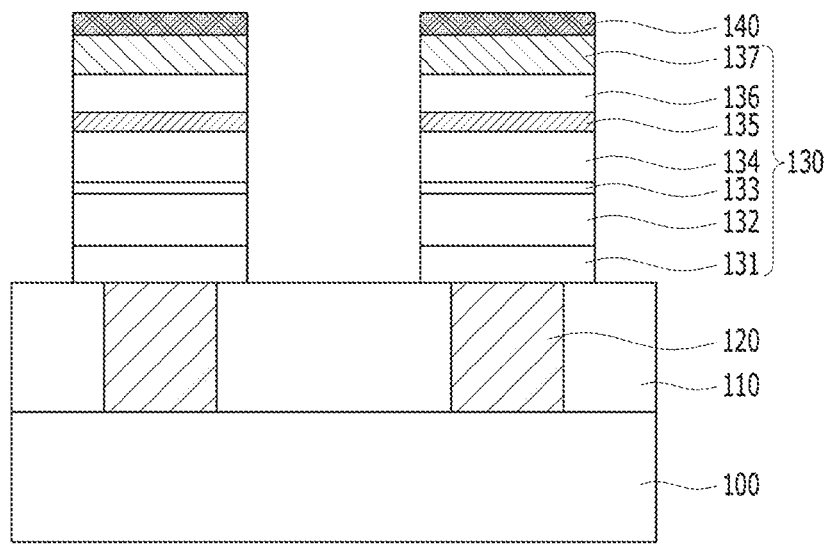
FIGS. 1A and 1B are cross-sectional views describing a semiconductor memory and a method for fabricating the semiconductor memory in accordance with a comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Prior to describing an implementation, a comparative example and a drawback thereof will be first described for a comparison with the implementation.

Figure 1B:
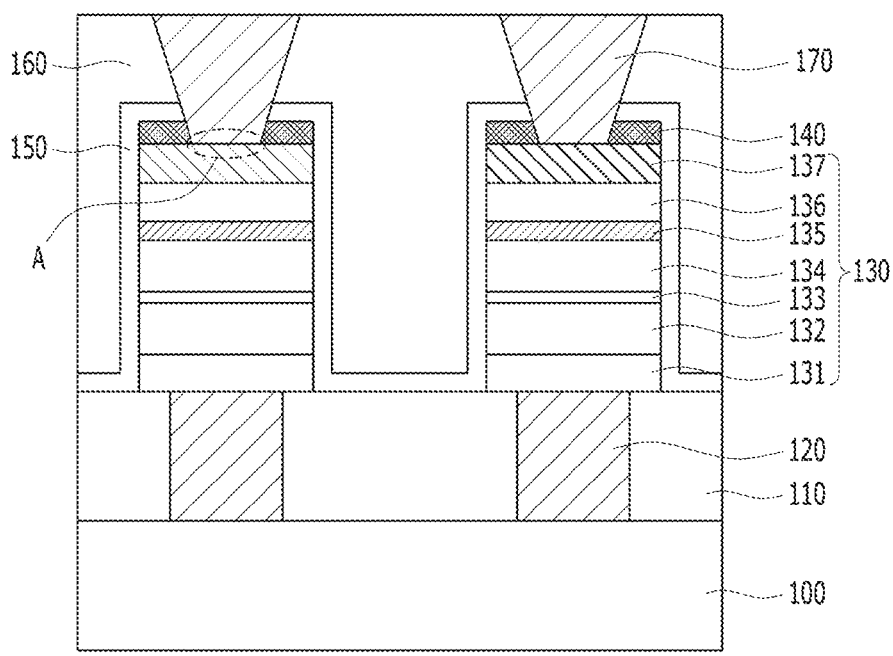

FIGS. 1A and 1B are cross-sectional views describing a semiconductor memory and a method for fabricating the semiconductor memory in accordance with a comparative example. The described semiconductor memory includes variable resistance elements for storing data. Each variable resistance element exhibits different resistance states of different resistance values which can be used to store data.

Referring to FIG. 1A, a first interlayer dielectric layer 110 may be formed over a substrate 100, and then a lower contact plug 120 passing through the first interlayer dielectric layer 110 and coupled to a portion of the substrate 100 may be formed.

Subsequently, a variable resistance element 130 in which an under layer 131, a free layer 132, a tunnel barrier layer 133, a pinned layer 134, a spacer layer 135, a magnetic correction layer 136 and a capping layer 137 are stacked may be formed over the first interlayer dielectric layer 110 and the lower contact plug 120. Here, the free layer 132 having a changeable magnetization direction, the tunnel barrier layer 133 allowing tunneling of electrons according to an applied voltage or current applied and the pinned layer 134 having a fixed magnetization direction may form a Magnetic Tunnel Junction (MTJ) structure. This variable resistance element 130 exhibits different resistance states based on different relative directions of the magnetizations of the pinned layer 134 and the free layer 132. The under layer 131 may be disposed under the MTJ structure and improve characteristics of the MTJ structure. The magnetic correction layer 136 may serve to offset or reduce an influence of a stray field generated by the pinned layer 134. The spacer layer 135 may be interposed between the magnetic correction layer 136 and the pinned layer 134 to physically separate them from each other. The capping layer 137 may include a metal which is a low resistance material so as to protect layers disposed under the capping layer 137 when patterning the variable resistance element 130 and coupling the variable resistance element 130 to an element disposed over the variable resistance element 130.

A hard mask pattern 140 which is used as an etch barrier when etching the stacked layers from the under layer 131 to the capping layer 137 for forming the variable resistance element 130 may be disposed over the variable resistance element 130. The hard mask pattern 140 may include a metal which is a low resistance material. The purpose of having low resistance material is to prevent the increase of contact resistance between an upper contact plug (see, the upper contact plug 170 of FIG. 1B) and the hard mask pattern even when the hard mask pattern 140 remains after etching for forming the variable resistance element 130.

Referring to FIG. 1B, a spacer 150 may be formed along a resultant structure of FIG. 1A and then a second interlayer dielectric layer 160 may be formed on the spacer 150.

Subsequently, a hole exposing an upper surface of the variable resistance element 130 may be formed by selectively etching the second interlayer dielectric layer 160 and the spacer 150, and then an upper contact plug 170 may be formed by filling the hole with a conductive material. When the hard mask pattern 140 remains as in the comparative example, an additional etching process can be performed on the hard mask pattern 140 which is exposed by etching the second interlayer dielectric layer 160 and the spacer 150.

In case of etching of the second interlayer dielectric layer 160 and the spacer 150, however, due to chemicals and/or gases used in the etching of the second interlayer dielectric layer 160 and the spacer 150, a metallic compound may be formed at an interface (see, a dotted circle "A") between the upper contact plug 170 and the variable resistance element 130. The metallic compound at the interface may be derived from a metal included in the hard mask pattern 140 and/or a metal included in the capping layer 137 and may have a resistance higher than that of the metal. Accordingly, when the metallic compound is formed, the contact resistance between the upper contact plug 170 and the variable resistance element 130 may be increased. Further, contact state between the upper contact plug 170 and the variable resistance element 130 may become bad due to the metallic compound.

Although it is possible to consider performing an over etch process in forming the hole which is filled with the upper contact plug 170 in order to remove the metallic compound, if so, the magnetic correction layer 136 under the capping layer 137 may be attacked, and thus switching characteristics of the variable resistance element 130 may be deteriorated.

In the implementation of the disclosed technology, it is provided a semiconductor memory which is capable of preventing the formation of undesired metallic compounds at an interface between an upper contact plug and a variable resistance element without an over etch process, and a method for fabricating the semiconductor memory. Hereinafter, this will be exemplarily described with reference to FIG. 2A to FIG. 3F.

FIGS. 2A to 2F are cross-sectional views describing a semiconductor memory and a method for fabricating the semiconductor memory in accordance with an implementation of the present disclosure.

First, the method for fabricating the semiconductor memory will be described.

Figure 2A:
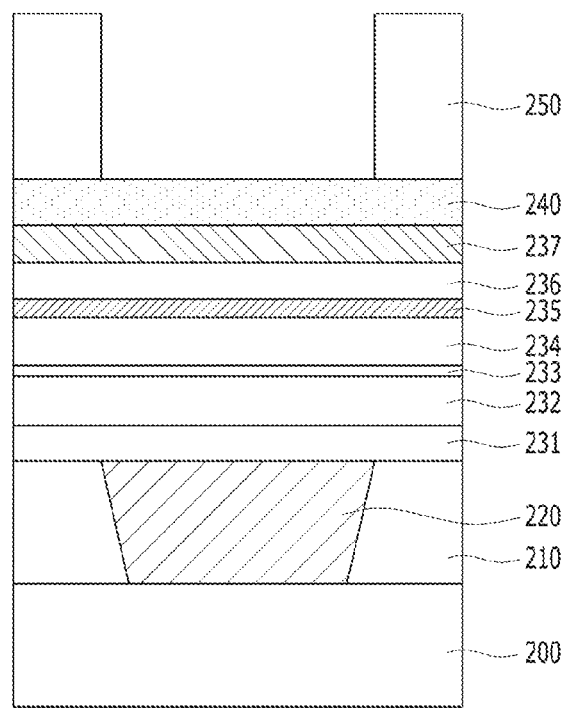
FIGS. 2A to 2F are cross-sectional views describing a semiconductor memory and a method for fabricating the semiconductor memory in accordance with an implementation of the present disclosure.

Referring to FIG. 2A, a substrate 200 where predetermined required structures such as switching device (not shown) are formed may be provided. Here, the switching device is an element to be coupled to a variable resistance element and control the supply of current or voltage to the variable resistance element. For example, the switching device may include a transistor and a diode. The switching device may have one end to be electrically connected to a lower contact plug 220, which is to be described below, and the other end to be electrically connected to a line that is not illustrated in the drawing, such as a source line.

Subsequently, a first interlayer dielectric layer 210 may be formed over the substrate 200 and then a lower contact plug 220 passing through the first interlayer dielectric layer 210 and coupled to a portion of the substrate 200, for example, one end of the switching element may be formed. The first interlayer dielectric layer 210 may include various insulating materials such as silicon oxide, silicon nitride or a combination thereof. The lower contact plug 220 may be formed by selectively etching the first interlayer dielectric layer 210 to form a contact hole exposing a portion of the substrate 200, depositing a conductive material in a thickness that sufficiently fills the contact hole, and performing a planarization process such as a Chemical Mechanical Polishing (CMP) process until an upper surface of the first interlayer dielectric layer 210 is exposed. The lower contact plug 220 may include a conductive material having an excellent filling property and high electrical conductivity, for example, a metal such as tungsten (W), tantalum (Ta), etc. or metal nitride such as titanium nitride (TiN), etc.

Subsequently, material layers for forming the variable resistance element, for example, a under layer 231, a free layer 232, a tunnel barrier layer 233, a pinned layer 234, a spacer layer 235, a magnetic correction layer 236 and a capping layer 237 may be formed over the first interlayer dielectric layer 210 and the lower contact plug 220.

Here, the free layer 232 may have a changeable magnetization direction so as to store data and be referred to as a storage layer. The pinned layer 234 may have a fixed magnetization direction so as to be compared with the magnetization direction of the free layer 232 and be referred to as a reference layer. The free layer 232 and the pinned layer 234 may have a single-layer structure or a multi-layer structure that includes a ferromagnetic material. For example, the free layer 232 and the pinned layer 234 may include an alloy containing Fe, Ni or Co as a major component such as an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or a stacked structure such as Co/Pt or Co/Pd. The magnetization directions of the free layer 232 and the pinned layer 234 may be substantially perpendicular to a surface of the layers. Hence, the magnetization direction of the free layer 232 may be changed between a downward direction and an upward direction, and the magnetization direction of the pinned layer 150 may be fixed to a downward direction or an upward direction. The change of the magnetization direction of the free layer 232 may be caused by spin transfer torque. The upper and lower positions of the free layer 232 and the pinned layer 234 may be changed with reference to the tunnel barrier layer 233. For example, unlike this implementation, the pinned layer 234 may be disposed under the tunnel barrier layer 233 and the free layer 232 may be disposed over the tunnel barrier layer 233.

The tunnel barrier layer 233 may allow tunneling of electrons between the free layer 232 and the pinned layer 234 during a data write operation that changes the resistance state of the variable resistance so as to change the magnetization direction of the free layer 232. The tunnel barrier layer 233 may include insulating oxide, for example, oxide such as MgO, CaO, SrO, TiO, VO, or NbO.

The free layer 232, the tunnel barrier layer 233 and the pinned layer 234 may form an MTJ structure.

The variable resistance element may further include one or more additional layers performing various functions to improve characteristics or processes of the MTJ structure. For example, as in the implementation, the under layer 231, the spacer layer 235, the magnetic correction layer 236 and the capping layer 237 may be further included. However, in another implementation, at least one of the under layer 231, the spacer layer 235 and the magnetic correction layer 236 may be omitted, or an additional layer (which is not shown) may be further included.

The under layer 231 may be referred to as an element of the variable resistance element which is disposed under the MTJ structure and can improve characteristics required for the MTJ structure, and have a single-layer structure or a multi-layer structure. For example, the under layer 231 may serve to improve perpendicular magnetic anisotropy of the MTJ structure. The under layer 231 may be distinguished from the lower contact plug 220 that is disposed under the variable resistance element and couples the variable resistance element to a lower constitutional element. Although, in the implementation, the under layer 231 is disposed on the first interlayer dielectric layer 210, if necessary, a portion or all of the under layer 231 may be disposed on the lower contact plug 220 and buried in the first interlayer dielectric layer 210 together with the lower contact plug 220.

The magnetic correction layer 236 may serve to offset or reduce an influence of a stray field generated by the pinned layer 234. As such, since the influence of the stray field of the pinned layer 234 is decreased, a bias magnetic field in the free layer 232 may be reduced. The magnetic correction layer 236 may have a magnetization direction that is anti-parallel to a magnetization direction of the pinned layer 234. For example, when the pinned layer 234 has a downward magnetization direction, the magnetic correction layer 236 may have an upward magnetization direction. Conversely, when the pinned layer 234 has an upward magnetization direction, the magnetic correction layer 236 may have a downward magnetization direction. The magnetic correction layer 236 may have a single-layer structure or a multi-layer structure that includes a ferromagnetic material.

Although, in the implementation, the magnetic correction layer 236 is disposed over the pinned layer 234, the position of the magnetic correction layer 236 may be placed at different positions in different implementations. For example, the magnetic correction layer 236 may be disposed under the MTJ structure. Alternatively, for another example, the magnetic correction layer 236 may be patterned separately from the MTJ structure and disposed over, under or beside the MTJ structure.

The spacer layer 235 may be interposed between the magnetic correction layer 236 and the pinned layer 234 so as to physically separate them from each other and provide an exchange coupling therebetween. The spacer layer 235 may include a noble metal such as Ru.

The capping layer 237 may serve to protect layers disposed under the capping layer 237 in patterning the variable resistance element and couple the variable resistance element to constitutional elements disposed over the variable resistance element. On this account, the capping layer 237 may include a metal which is a low resistance material. In particular, the capping layer 237 may include a noble metal, for example, Ru, which has a small amount of pin holes in the layer and exhibits high resistance to wet and/or dry etch.

Subsequently, a sacrificial layer 240 may be formed over the capping layer 237. The sacrificial layer 240 may be removed during a subsequent process and thus not exist in a final structure. The sacrificial layer 240 may be formed of or include a material which is easily removed. For example, the sacrificial layer 240 may include a carbon-containing material which is easily removed by oxygen strip.

Subsequently, a mold layer 250 for providing a space for forming a hard mask pattern may be formed over the sacrificial layer 240. The mold layer 250 may include an insulating material such as silicon oxide, etc.

Figure 2B:
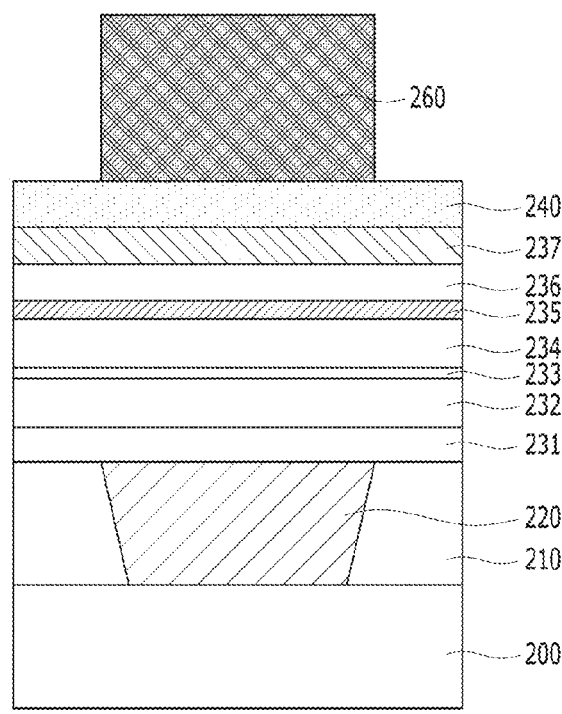

Referring to FIG. 2B, a hard mask pattern 260 may be formed by filling the mold layer 250 with a conductive material. Here, the hard mask pattern 260 may include a metal which is a low resistance material, for example, W, etc.

Subsequently, the mold layer 250 may be removed. As a result, only the hard mask pattern 260 may remain over the sacrificial layer 240.

Meanwhile, although it is not shown, when forming the hard mask pattern 260, instead of forming the mold layer 250 and filling the mold layer 250 with a metallic material as in the implementation, it is possible to depositing a metallic material over the sacrificial layer 240 and then selectively etching the metallic material.

Figure 2C:
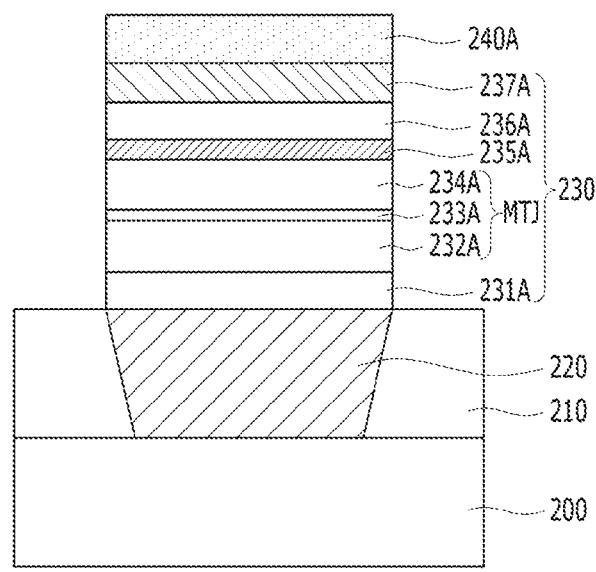

Referring to FIG. 2C, the sacrificial layer 240, the capping layer 237, the magnetic correction layer 236, the spacer layer 235, the pinned layer 234, the tunnel barrier layer 233, the free layer 232 and the under layer 231 may be etched by using the hard mask pattern 260 as an etch barrier so as to form a variable resistance element 230 in which an under layer pattern 231A, a free layer pattern 232A, a tunnel barrier layer pattern 233A, a pinned layer pattern 234A, a spacer layer pattern 235A, a magnetic correction layer pattern 236A and a capping layer pattern 237A are stacked, and a sacrificial layer pattern 240A which is disposed over the variable resistance element 230 and has sidewalls aligned with the variable resistance element 230. During this etch process or by an additional removal process, the hard mask pattern 260 may be completely removed. The variable resistance element 230 and the sacrificial layer pattern 240A may have substantially vertical sidewalls. That is, the sidewalls of the variable resistance element 230 and the sacrificial layer pattern 240A may be perpendicular to a surface of the substrate, or inclined at a slight angle with a line perpendicular to the surface of the substrate.

Figure 2D:
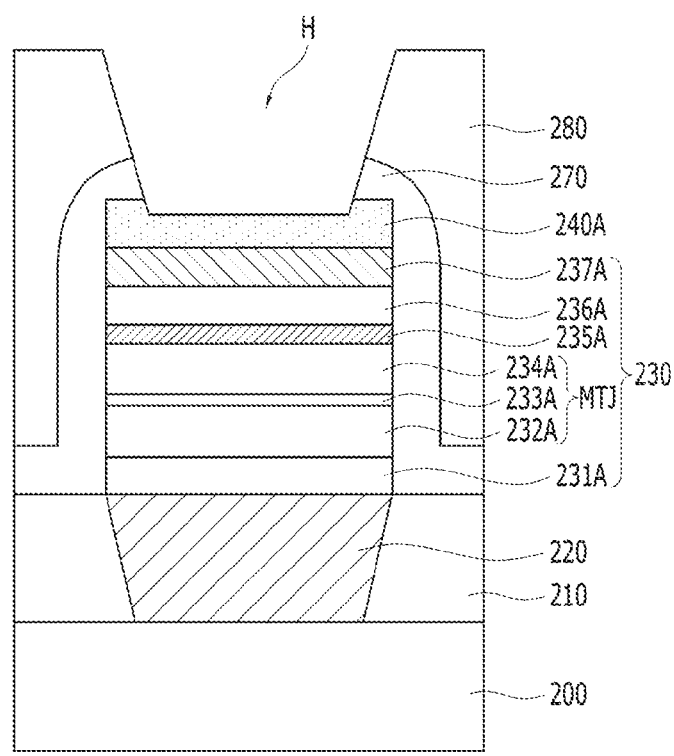

Subsequently, referring to FIG. 2D, a spacer 270 may be formed along a resultant structure of FIG. 2C. The spacer 270 may serve to protect the variable resistance element 230 and be formed of or include an insulating material such as silicon nitride, etc. The formation of the spacer 270 may be omitted as necessary.

Subsequently, a second interlayer dielectric layer 280 may be formed on the spacer 270. The second interlayer dielectric layer 280 may be formed of or include an insulating material different from the spacer 270, for example, silicon oxide, etc. The second interlayer dielectric layer 280 may be formed by depositing an insulating material and performing a planarization process so as to have a planarized upper surface.

Subsequently, the second interlayer dielectric layer 280 and the spacer 270 may be selectively etched so as to form an initial hole H exposing the sacrificial layer pattern 240A. Here, when etching the spacer 270, etch selectivity of the spacer 270 to the sacrificial layer pattern 240A may be controlled in a range from about 1:1 to about 10:1 so that the etch process stops over or within the sacrificial layer pattern 240A before the etch process proceeds on the capping layer pattern 237A. The initial hole H may be formed by a dry etch process and thus have a shape in which a width becomes narrower downwardly. The initial hole H may overlap with the sacrificial layer pattern 240A and have a lower surface which is smaller than an upper surface of the sacrificial layer pattern 240A in size.

Figure 2E:
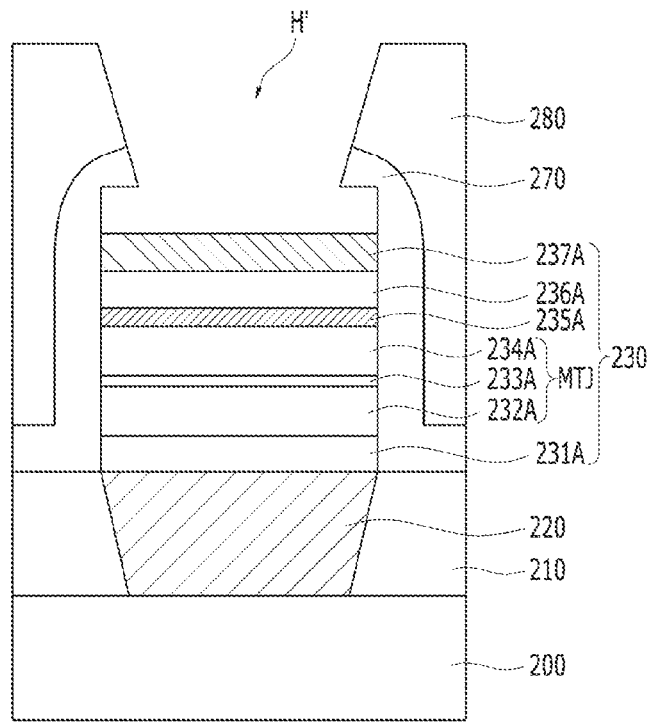

Referring to FIG. 2E, a final hole H' exposing the capping layer pattern 237A may be formed by removing the sacrificial layer pattern 240A which is exposed by the initial hole H. Here, when the sacrificial layer pattern 240A includes a carbon-containing material, the sacrificial layer pattern 240A may be easily removed by an oxygen strip process. The oxygen strip process removes the sacrificial layer pattern 240A only and does not affect to other remaining layers of the variable resistance element 230.

Since the initial hole H has a shape in which a width becomes narrower downwardly and a lower surface which is smaller than an upper surface of the sacrificial layer pattern 240A, the final hole H' may have a wine glass-like shape having an upper portion corresponding to the initial hole H and a lower portion corresponding to the sacrificial layer pattern 240A that has been removed. The final hole H' has an upper end, a lower end, and a predetermined portion between the upper end and the lower end. The predetermined portion of the final hole H' is dented or depressed inwardly in comparison with the upper end and the lower end of the final hole H'. That is, the predetermined portion of the final hole H' between the upper end and the lower end of the final hole H' may have a width in a horizontal direction narrower than that of each of the upper end and the lower end of the final hole H'. While an upper portion of the final hole H' corresponding to the initial hole H may have a shape in which a width becomes narrower downwardly, a lower portion of the final hole H' corresponding to the sacrificial layer pattern 240A may have a shape in which a width is substantially constant regardless of a height. That is, the lower portion of the final hole H' may have a sidewall which is perpendicular to the surface of the substrate, or inclined at a slight angle with a line perpendicular to the surface of the substrate. Therefore, a gradient of the sidewall of the upper portion of the final hole H' is higher than that of the sidewall of the lower portion of the final hole H'.

Since the exposure of the capping layer pattern 237A is performed by the removal process of the sacrificial layer pattern 240A, for example, the oxygen strip process, there is no problem of exposing the capping layer pattern 237A to chemicals and/or gases used for etching the second interlayer dielectric layer 280 and the spacer 270. Accordingly, it is possible to prevent formation of a metallic compound over the capping layer pattern 237A due to a metal included in the capping layer pattern 237A.

Meanwhile, when the removal of the sacrificial layer pattern 240A is performed by the oxygen strip process, metal oxide may be formed over the capping layer pattern 237A due to a metal included in the capping layer pattern 237A. However, in comparison with the time when the capping layer 137 is exposed to chemicals and/or gases in etching the second interlayer dielectric layer 160 and the spacer 150 in the comparative example of FIGS. 1A and 1B, the time during which the capping layer pattern 237A is exposed to oxygen in the implementation can be very short. This is because the removal of the carbon-containing material is very easy by the oxygen strip process. Accordingly, an amount of the metal oxide formed over the capping layer pattern 237A may be very small so as to hardly exert an influence on contact resistance or contact characteristics with an upper contact plug (290 of FIG. 2F) to be described below. As necessary, after forming the final hole H', an additional etch process for removing the metal oxide formed over the capping layer pattern 237A can be performed. The additional etch process may be performed by using an inert gas such as Ar, etc. Since, in the additional etch process, it is required to remove only a small amount of the metal oxide, an over etch process is not necessary. That is, it is possible to completely remove the metal oxide while the magnetic correction layer pattern 236A under the capping layer pattern 237A is not attacked.

Figure 2F:
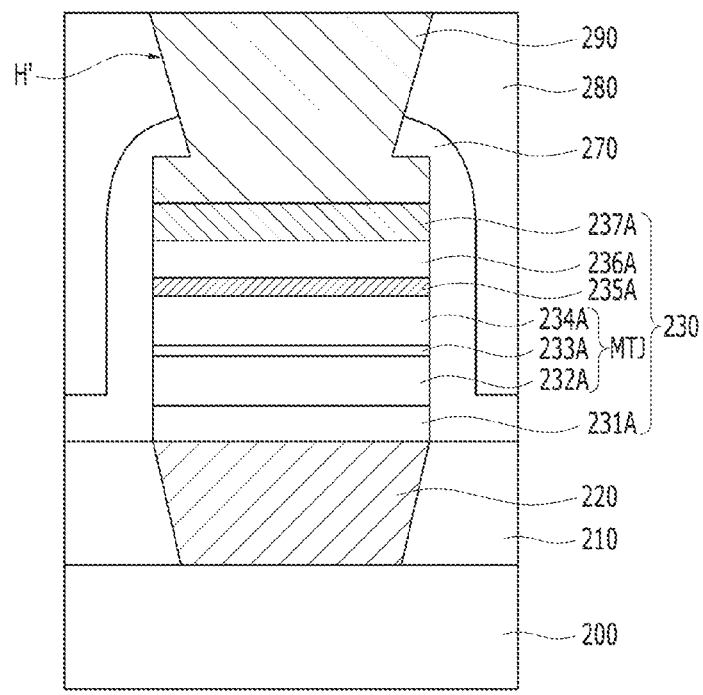

Referring to FIG. 2F, an upper contact plug 290 filling the final hole H' may be formed. The upper contact plug 290 may be formed by depositing a conductive material in a thickness that sufficiently fills the final hole H' and performing a planarization process until an upper surface of the second interlayer dielectric layer 280 is exposed. The upper contact plug 290 may include a conductive material having an excellent filling property and high electrical conductivity, for example, a metal such as tungsten (W), tantalum (Ta), etc. or metal nitride such as titanium nitride (TiN), etc.

The semiconductor memory shown in FIG. 2F may be fabricated through the process described above.

Referring back to FIG. 2F, the semiconductor memory in accordance with the implementation of the present disclosure may include the lower contact plug 220 disposed over the substrate 200 and coupled a portion of the substrate 200, the variable resistance element 230 disposed over the lower contact plug 220 and coupled to the lower contact plug 220, and the upper contact plug 290 disposed over the variable resistance element 230 and coupled to the variable resistance element 230.

In some implementations, the upper contact plug 290 may have a wine glass-like shape in which a width is decreased and then increased along a downward direction perpendicular to a surface of the upper contact plug 290. More specifically, an upper portion of the upper contact plug 290 may have a shape in which a width becomes narrower downwardly, while a lower portion of the upper contact plug 290 may have a shape in which a width is substantially constant. The width of the lower portion of the upper contact plug is greater than the smallest width of the upper portion of the upper contact plug 290. Moreover, the upper portion of the upper contact plug 290 may not have sidewalls aligned with the variable resistance element 230, while the lower portion of the upper contact plug 290 may have sidewalls aligned with the variable resistance element 230.

In the semiconductor memory, the variable resistance element 230 is structured to exhibit different resistance states of different resistance values for representing different data for data storage. The variable resistance element 230 may store data by switching between different resistance states by applying a voltage or current of a sufficient magnitude to the upper end and lower end of the variable resistance element 230 through the lower contact plug 220 and the upper contact plug 290. In some implementations, the variable resistance element 230 may store data as the magnetization direction of the free layer pattern 232A is changed according to a voltage or current applied to the variable resistance element 230. When the magnetization directions of the free layer pattern 232A and the pinned layer pattern 234A are parallel to each other, the variable resistance element 230 may be in a low resistance state and, for example, a particular designated digital data bit such as "1". When the magnetization directions of the free layer pattern 232A and the pinned layer pattern 234A are anti-parallel to each other, the variable resistance element 230 may be in a high resistance state and, for example, may store a particular designated digital data bit such as "0". The particular data bit to be stored in the variable resistance element 230 can be different such than the data bit "0" is stored when the free layer pattern 232A and the pinned layer pattern 234A are parallel to each other and the data bit "1" is stored when the free layer pattern 232A and the pinned layer pattern 234A are anti-parallel to each other.

According to the semiconductor memory and the method for fabricating the same described above, it is possible to prevent or minimize the formation of a metallic compound at an interface between the variable resistance element 230 and the upper contact plug 290. Therefore, contact resistance between the variable resistance element 230 and the upper contact plug 290 can be reduced so as to secure an excellent contact state.

Further, since the etch process for forming the upper contact plug 290 stops over or within the sacrificial layer pattern 240A before the etch process proceeds on the capping layer pattern 237A, it is possible to prevent an attack on the variable resistance element 230. As a result, data store characteristics and operation characteristics of the variable resistance element 230 can be improved.

Meanwhile, in the above implementation, it is explained that the hard mask pattern 260 used as an etch barrier in patterning the variable resistance element 230 is completely removed. However, in another implementation, a portion of the hard mask pattern 260 may remain. This is because etch loading may vary depending on the position of the variable resistance element 230. This will be exemplarily described with reference to FIGS. 2G to 2I.

Figure 2G:
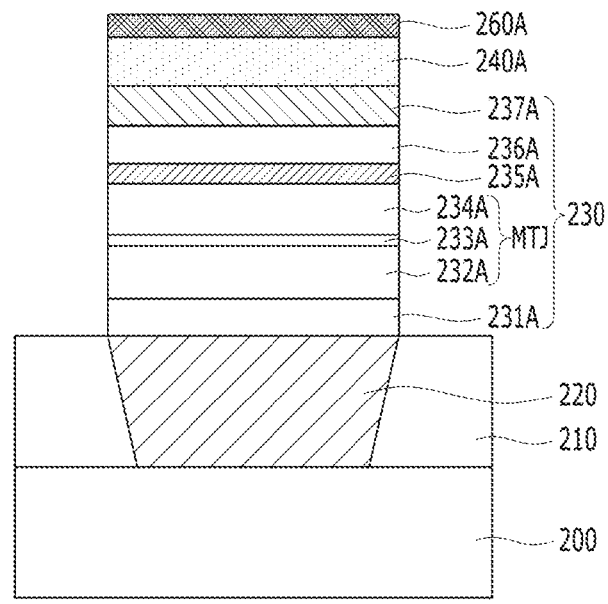
FIGS. 2G to 2I are cross-sectional views describing a semiconductor memory and a method for fabricating the semiconductor memory in accordance with another implementation of the present disclosure.
Figure 2H:
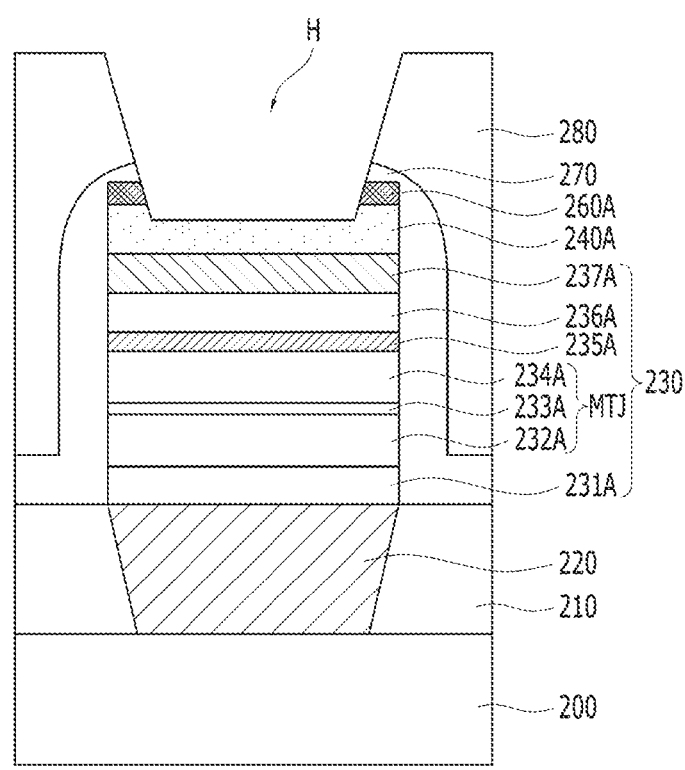
Figure 2I:
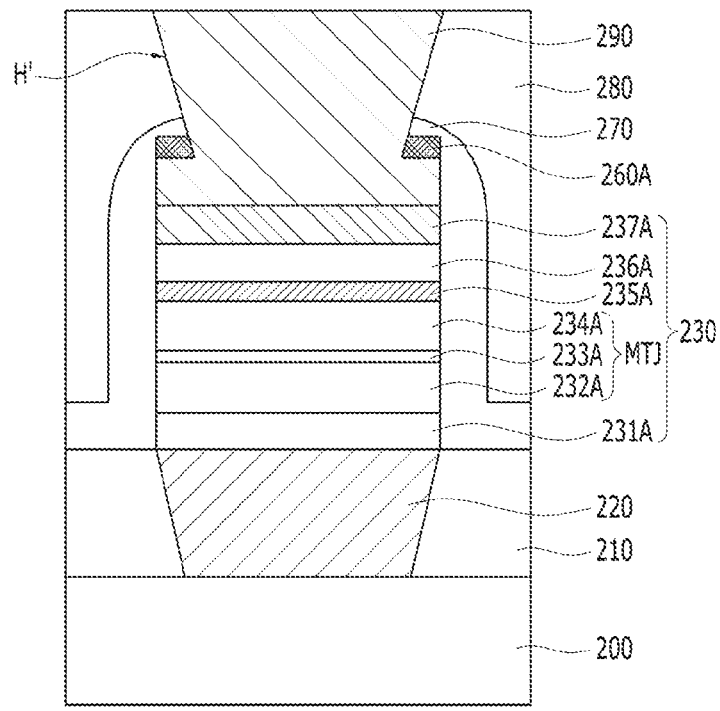

FIGS. 2G to 2I are cross-sectional views describing a semiconductor memory and a method for fabricating the semiconductor memory in accordance with another implementation of the present disclosure. A detailed description for substantially the same parts as the above implementation is omitted.

Referring to FIG. 2G, during the etch process for forming a variable resistance element 230, a hard mask pattern 260 may not be completely removed and remain in a predetermined thickness over the variable resistance element 230. Hereinafter, this is referred to as a remaining hard mask pattern 260A. The remaining hard mask pattern 260A may have sidewalls aligned with sidewalls of the variable resistance element 230.

Referring to FIG. 2H, an initial hole H exposing a sacrificial layer pattern 240A may be formed by forming a spacer 270 and a second interlayer dielectric layer 280 over a resultant structure of FIG. 2G, and then selectively etching the second interlayer dielectric layer 280, the spacer 270 and the remaining hard mask pattern 260A. Here, although a metallic compound resulting from a metal included in the remaining hard mask pattern 260A may be formed over the sacrificial layer pattern 240A, the metallic compound can be removed in a subsequent process for removing the sacrificial layer pattern 240A.

Referring to FIG. 2I, a final hole H' exposing a capping layer pattern 237A may be formed by removing the sacrificial layer pattern 240A exposed by the initial hole H. As described above, in this process, the metallic compound over the sacrificial layer pattern 240A can be removed.

When the removal of the sacrificial layer pattern 240A is performed by the oxygen strip process, a small amount of metal oxide may be formed over the capping layer pattern 237A due to the metal included in the capping layer pattern 237A. Accordingly, an additional etch process using an inert gas may be performed in order to remove the metal oxide.

In this process, at least a portion of the remaining hard mask pattern 260A may be oxidized and changed into insulating metal oxide.

Subsequently, an upper contact plug 290 may be formed by filling the final hole H' with a conductive material. The upper contact plug 290 may have an upper portion corresponding to the initial hole H and a lower portion corresponding to the removed sacrificial layer pattern 240A. The remaining hard mask pattern 260A may be positioned over an upper surface of the lower portion of the upper contact plug 290 having sidewalls aligned with the variable resistance element 230. Outer sidewalls of the remaining hard mask pattern 260A may be aligned with the variable resistance element 230, and inner sidewalls of the remaining hard mask pattern 260A may surround a lower side wall of the upper portion of the upper contact plug 290.

Contrary to the above described implementation as described in FIG. 2F, in this implementation, sidewalls of the upper contact plug 290 may come in contact with not only the spacer 270 and the second interlayer dielectric layer 280 but also the remaining hard mask pattern 260A or oxide thereof. According to the implementation, even if the remaining hard mask pattern 260A remains, it is possible to remove a metallic compound due to the remaining hard mask 260A. As result, the same effect as the above described implementation can be exhibited.

FIGS. 3A to 3E are cross-sectional views describing a semiconductor memory and a method for fabricating the semiconductor memory in accordance with still another implementation of the present disclosure. The following descriptions will be focused on a difference from the above described implementations.

Figure 3A:
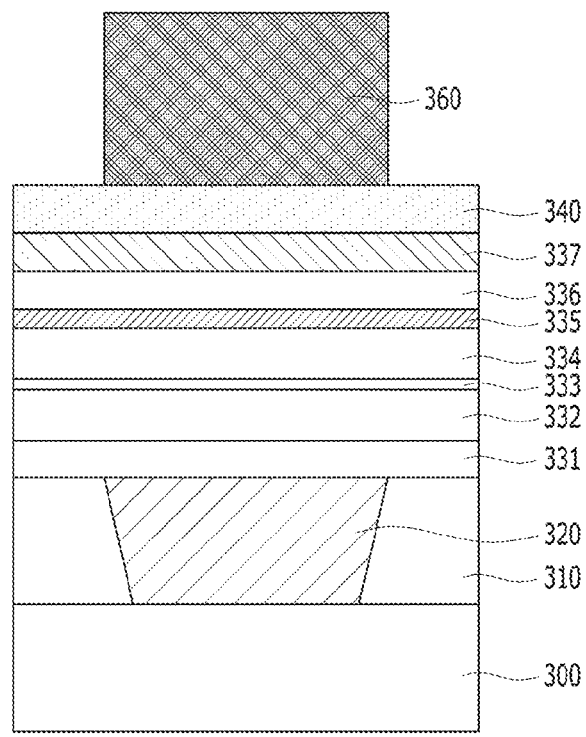
FIGS. 3A to 3E are cross-sectional views describing a semiconductor memory and a method for fabricating the semiconductor memory in accordance with still another implementation of the present disclosure.

Referring to FIG. 3A, a first interlayer dielectric layer 310 may be formed over a substrate 300 and a lower contact plug 320 passing through the first interlayer dielectric layer 310 and coupled to a portion of the substrate 300 may be formed.

Subsequently, material layers for forming a variable resistance element, for example, an under layer 331, a free layer 332, a tunnel barrier layer 333, a pinned layer 334, a spacer layer 335, a magnetic correction layer 336 and a capping layer 337 may be formed over the first interlayer dielectric layer 310 and the lower contact plug 320. Subsequently, a sacrificial layer 340 and a hard mask pattern 360 for patterning the variable resistance element may be formed over the capping layer 337. The forming of the variable resistance element proceeds in two subsequent etching processes that are shown in FIGS. 3B and 3C.

Figure 3B:
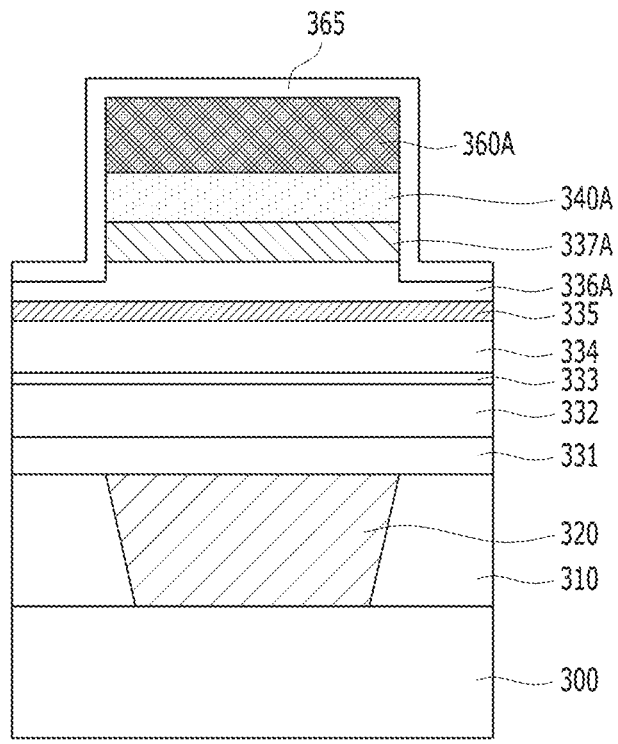

Referring to FIG. 3B, the layers disposed under the hard mask pattern 360 may be etched by using the hard mask pattern 360 as an etch barrier. Here, an etch depth may be controlled so that at least the sacrificial layer 340 is completely etched, while only a portion of the material layers for forming a variable resistance element is etched. In the implementation, the sacrificial layer 340, the capping layer 337 and a portion of the magnetic correction layer 336 may be etched. However, an etch depth may be controlled in various manners as long as the sacrificial layer 340 is completely etched. For example, although it is not shown, the etch depth can be controlled such that all of the magnetic correction layer 336 is etched and all or a portion of the layers disposed under the magnetic correction layer 336, for example, the spacer layer 335 and the MTJ structure are etched. Further, a portion of the under layer 331 is etched. For the convenience of explanation, the etched sacrificial layer 340 and the etched capping layer 337 are referred to as a sacrificial layer pattern 340A and a capping layer pattern 337A, respectively. Moreover, the etched magnetic correction layer 336 is referred to as an initial magnetic correction layer pattern 336A. Referring to FIG. 3B, the initial magnetic correction layer 336A has a non-exposed portion disposed under the capping layer pattern 337A and exposed portions on both sides of the non-exposed portion of the initial magnetic correction layer 336A. The exposed portions of the initial magnetic correction layer 336A have a smaller thickness than that of the non-exposed portion of the initial magnetic correction layer 336A. In addition, the hard mask pattern 360A has a thickness decreased in this etch process as compared to the hard mask pattern 360.

Subsequently, a protective layer 365 may be formed along an etched resultant structure including an upper surface and sidewalls of the hard mask pattern 360A, sidewalls of the sacrificial layer pattern 340A, sidewalls of the capping layer pattern 337A, and sidewalls of the non-exposed portion of the initial magnetic correction layer pattern 336A and an upper surface of the exposed portions of the initial magnetic correction layer pattern 336A. The protective layer 365 may serve to prevent the sacrificial layer pattern 340A from being damaged in the etch process for forming the variable resistance element. The protective layer 365 may include various insulating materials such as silicon nitride, silicon oxide or a combination thereof.

Figure 3C:
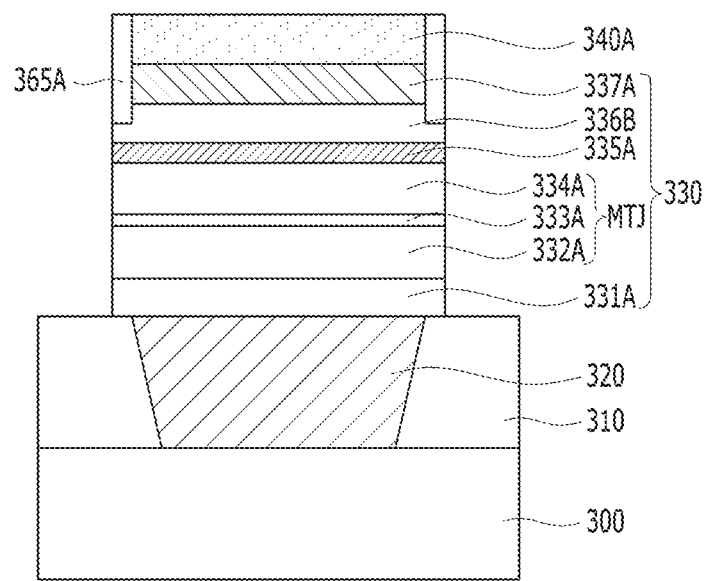

Referring to FIG. 3C, the etching process is further performed to form the variable resistance element 330. The protective layer 365 is etched to form a protective layer pattern 365A. The protective layer pattern 365A is formed by performing a blanket etch process on the protective layer 365 such that an upper surface of the initial magnetic correction layer pattern 336A is exposed. The exposed upper surface of the initial magnetic correction layer pattern 336A corresponds to the surface of the non-exposed portion of the initial magnetic correction layer in FIG. 3B. The protective layer pattern 365A may be formed on the sidewalls of the hard mask pattern 360A, the sidewalls of the sacrificial layer pattern 340A, the sidewalls of the capping layer pattern 337A, and the sidewalls of the etched portion of the initial magnetic correction layer pattern 336A.

Subsequently, the unetched portion among the material layers for forming the variable resistance element in the etch process of FIG. 3B, for example, the unetched portion including the exposed portions of the initial magnetic correction layer pattern 336A, the spacer layer 335, the pinned layer 334, the tunnel barrier layer 333, the free layer 332 and the under layer 331 may be etched by using the protective layer pattern 365A and the hard mask pattern 360A as an etch barrier so as to form a variable resistance element 330. Referring to FIGS. 3B and 3C, the etch process for forming the variable resistance element 330 may include a first etch process of FIG. 3B and a second etch process of FIG. 3C. For the convenience of explanation, the initial magnetic correction layer pattern 336A, the spacer layer 335, the pinned layer 334, the tunnel barrier layer 333, the free layer 332 and the under layer 331 which are etched in the second etch process are referred to as a magnetic correction layer pattern 336B, a spacer layer pattern 335A, a pinned layer pattern 334A, a tunnel barrier layer pattern 333A, a free layer pattern 332A and an under layer pattern 331A, respectively. As such, the va7riable resistance element 330 may include a stacked structure including the under layer pattern 331A, the free layer pattern 332A, the tunnel barrier layer pattern 333A, the pinned layer pattern 334A, the spacer layer pattern 335A, the magnetic correction layer pattern 336B and the capping layer pattern 337A. In the variable resistance element 330, an upper portion which is etched in the first etch process may have a width narrower than that of a lower portion which is etched in the second etch process. A sacrificial layer pattern 340A having sidewalls aligned with the upper portion which is etched in the first etch process in the variable resistance element 330 may be disposed over the variable resistance element 330.

Meanwhile, in the implementation, the hard mask pattern 360A may be completely removed during the second etch process or by a separate and additional etch process. As a result, an upper portion of the protective layer pattern 365A may be removed so that an upper end of the protective layer pattern 365A may be positioned at substantially the same level as an upper surface of the sacrificial layer pattern 340A.

Figure 3D:
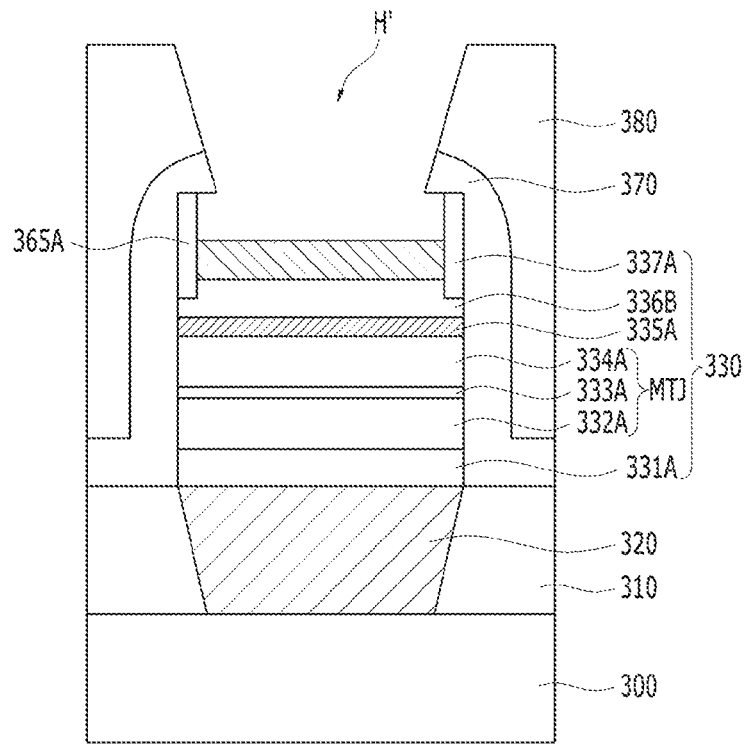

Referring to FIG. 3D, a spacer 370 and a second interlayer dielectric layer 380 may be formed along a resultant structure of FIG. 3D, and then a final hole H' may be formed by selectively etching the second interlayer dielectric layer 380 and the spacer 370 to expose the sacrificial layer pattern 340A and removing the exposed sacrificial layer pattern 340A.

Figure 3E:
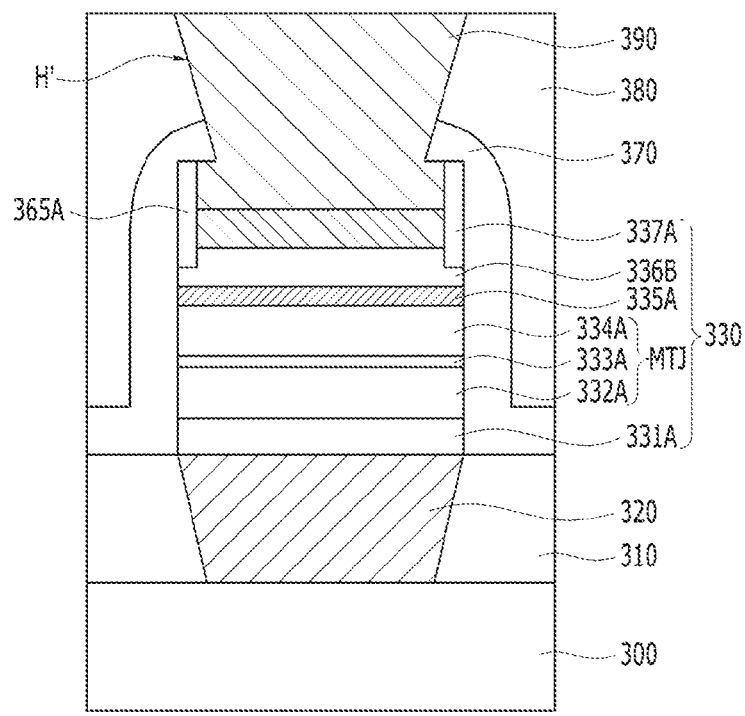

Referring to FIG. 3E, an upper contact plug 390 may be formed by filling the final hole H' with a conductive material. Sidewalls of a lower portion of the upper contact plug 390 may be surrounded by a protective layer pattern 365A.

Unlike the above implementations, the variable resistance element 330 has an upper portion with a width narrower than that of a lower portion of the variable resistance element 330, and the protective layer pattern 365A may be disposed on sidewalls of the upper portion. In addition, sidewalls of the upper contact plug 390 may come in contact with not only the spacer 370 and the second interlayer dielectric layer 380, but also the protective layer pattern 365A. According to the implementation, it is possible to prevent formation of a metallic compound between the variable resistance element 330 and the upper contact plug 390 and also prevent damage or removal of the sacrificial layer pattern 340A in the etch process for forming the variable resistance element 330.

Meanwhile, in the above implementation, the hard mask pattern 360 which is used as an etch barrier in patterning the variable resistance element 330 is completely removed. However, in another implementation, a portion of the hard mask pattern 360 may remain. This will be exemplarily explained with reference to FIG. 3F and FIG. 3G.

Figure 3F:
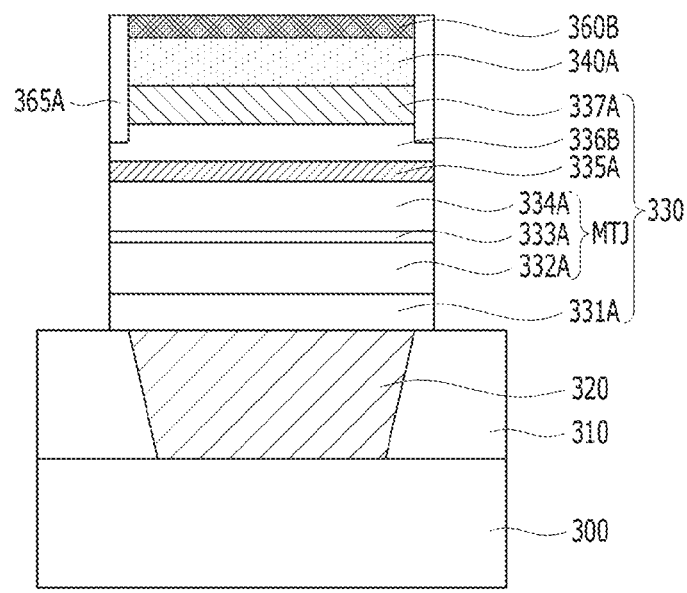
FIGS. 3F and 3G are cross-sectional views describing a semiconductor memory and a method for fabricating the semiconductor memory in accordance with further another implementation of the present disclosure.
Figure 3G:
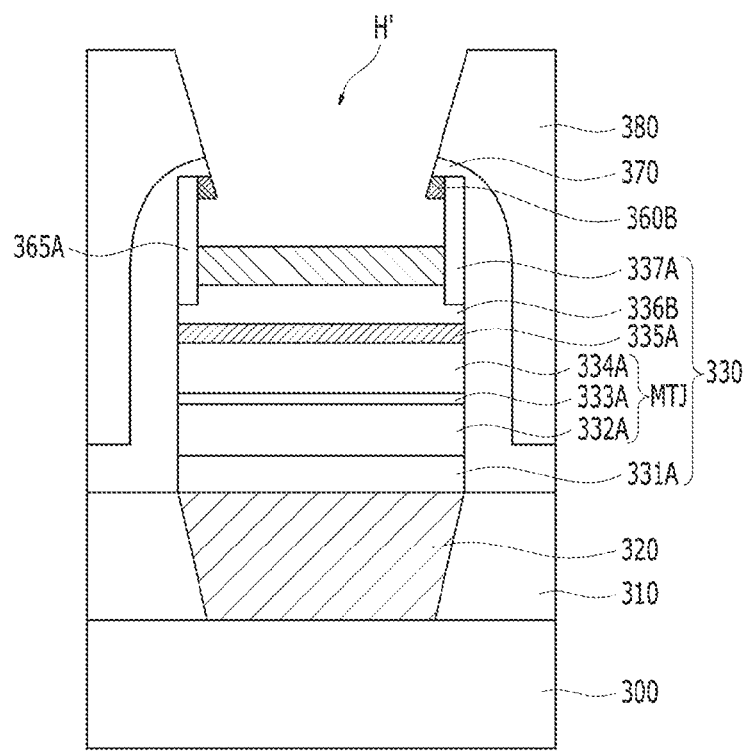

FIGS. 3F and 3G are cross-sectional views describing a semiconductor memory and a method for fabricating the semiconductor memory in accordance with further another implementation of the present disclosure.

Referring to FIG. 3F, during a second etch process for forming a variable resistance element 330 (see, FIG. 3C), a hard mask pattern 60A may not be completely removed so as to remain in a predetermined thickness. This is referred to as a remaining hard mask pattern 360B.

The remaining hard mask pattern 360B may have sidewalls aligned with portions of sidewalls including upper sidewalls of the variable resistance element 330. In addition, an upper end of the protective layer pattern 365A may be positioned at substantially the same level as an upper surface of the remaining hard mask pattern 360B.

Referring to FIG. 3G, a spacer 370 and a second interlayer dielectric layer 380 may be formed over a resultant structure of FIG. 3G, and then a final hole H' may be formed by selectively etching the second interlayer dielectric layer 380, the spacer 370 and the remaining hard mask pattern 360B to form an initial hole exposing the sacrificial layer pattern 340A and removing the sacrificial layer pattern 340A exposed by the initial hole.

Subsequently, although it is not shown, an upper contact plug may be formed by filling the final hole H' with a conductive material. Sidewalls of the upper contact plug may come in contact with not only the spacer 370, the second interlayer dielectric layer 380 and the protective layer pattern 365A, but also the remaining hard mask pattern 360B or oxide thereof.

The above and other memory circuits or semiconductor devices based on the disclosed technology can be used in a range of devices or systems. FIGS. 4-8 provide some examples of devices or systems that can implement the memory circuits disclosed herein.

Figure 4:
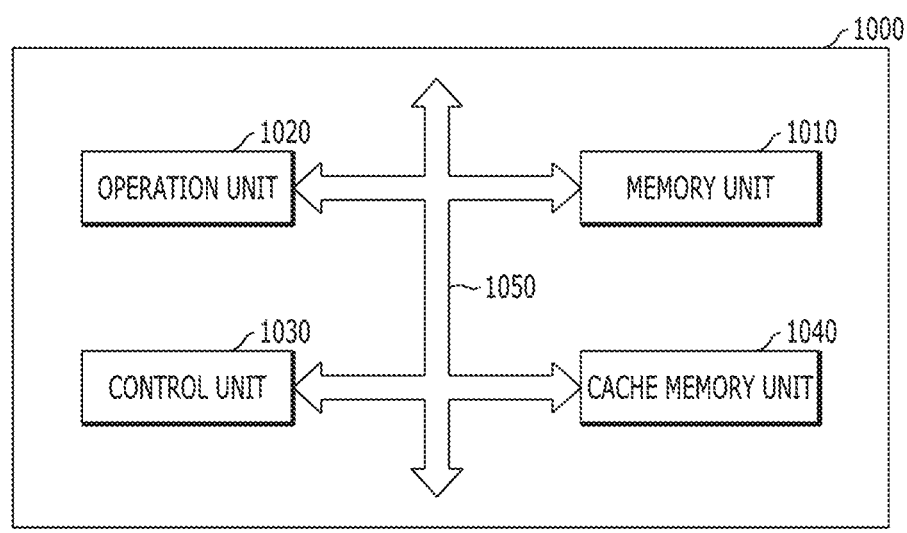
FIG. 4 is an example of configuration diagram of a microprocessor implementing memory circuitry based on the disclosed technology.

FIG. 4 is an example of configuration diagram of a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a variable resistance element disposed over a substrate and structured to exhibit different resistance states for storing data; and an upper contact plug disposed over the variable resistance element and coupled to the variable resistance element, wherein the upper contact plug includes a first portion that is disposed between an upper end of the upper contact plug and a lower end of the upper contact plug and the first portion has a width smaller than a width of each of the upper end and the lower end. Through this, data storage characteristics and operating characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
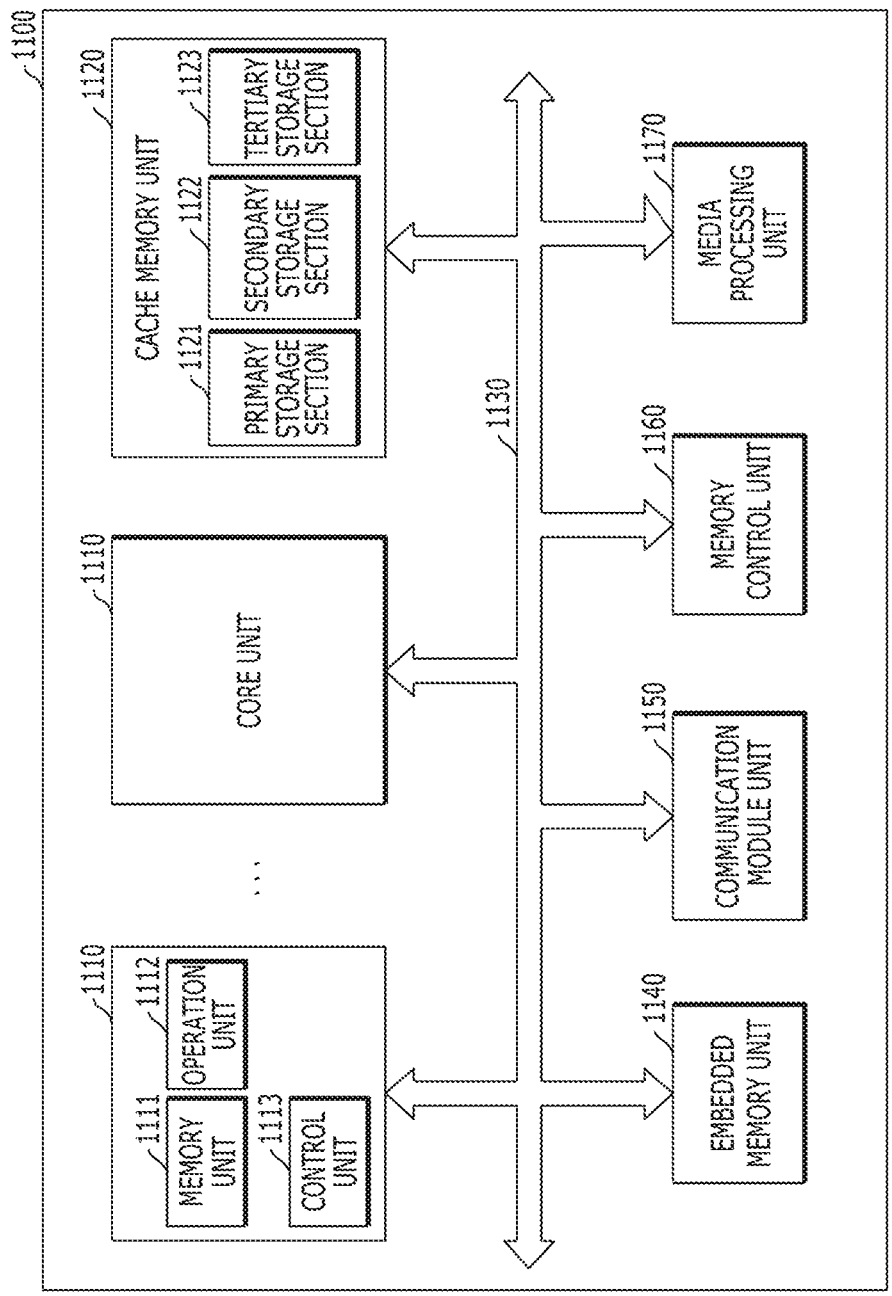
FIG. 5 is an example of configuration diagram of a processor implementing memory circuitry based on the disclosed technology.

FIG. 5 is an example of configuration diagram of a processor implementing memory circuitry based on the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a variable resistance element disposed over a substrate and structured to exhibit different resistance states for storing data; and an upper contact plug disposed over the variable resistance element and coupled to the variable resistance element, wherein the upper contact plug includes a first portion that is disposed between an upper end of the upper contact plug and a lower end of the upper contact plug and the first portion has a width smaller than a width of each of the upper end and the lower end. Through this, data storage characteristics and operating characteristics of the cache memory unit 1120 may be improved. As a consequence, operating characteristics of the processor 1100 may be improved.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
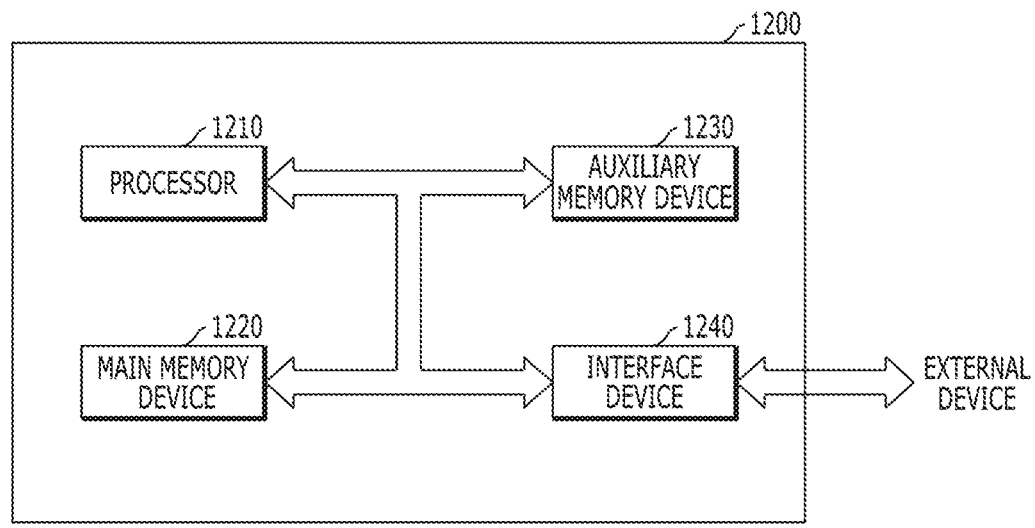
FIG. 6 is an example of configuration diagram of a system implementing memory circuitry based on the disclosed technology.

FIG. 6 is an example of configuration diagram of a system implementing memory circuitry based on the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a variable resistance element disposed over a substrate and structured to exhibit different resistance states for storing data; and an upper contact plug disposed over the variable resistance element and coupled to the variable resistance element, wherein the upper contact plug includes a first portion that is disposed between an upper end of the upper contact plug and a lower end of the upper contact plug and the first portion has a width smaller than a width of each of the upper end and the lower end. Through this, data storage characteristics and operating characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance element disposed over a substrate and structured to exhibit different resistance states for storing data; and an upper contact plug disposed over the variable resistance element and coupled to the variable resistance element, wherein the upper contact plug includes a first portion that is disposed between an upper end of the upper contact plug and a lower end of the upper contact plug and the first portion has a width smaller than a width of each of the upper end and the lower end. Through this, data storage characteristics and operating characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
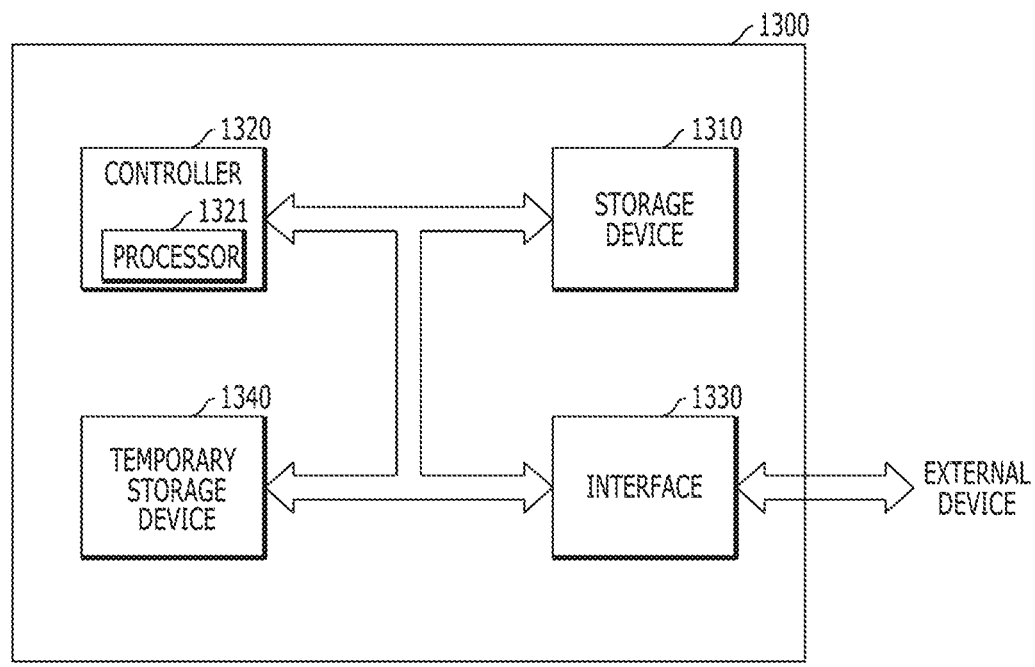
FIG. 7 is an example of configuration diagram of a data storage system implementing memory circuitry based on the disclosed technology.

FIG. 7 is an example of configuration diagram of a data storage system implementing memory circuitry based on the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a variable resistance element disposed over a substrate and structured to exhibit different resistance states for storing data; and an upper contact plug disposed over the variable resistance element and coupled to the variable resistance element, wherein the upper contact plug includes a first portion that is disposed between an upper end of the upper contact plug and a lower end of the upper contact plug and the first portion has a width smaller than a width of each of the upper end and the lower end. Through this, data storage characteristics and operating characteristics of the storage device 1310 or the temporary storage device 1340 may be improved. As a consequence, operating characteristics and data storage characteristics of the data storage system 1300 may be improved.

Figure 8:
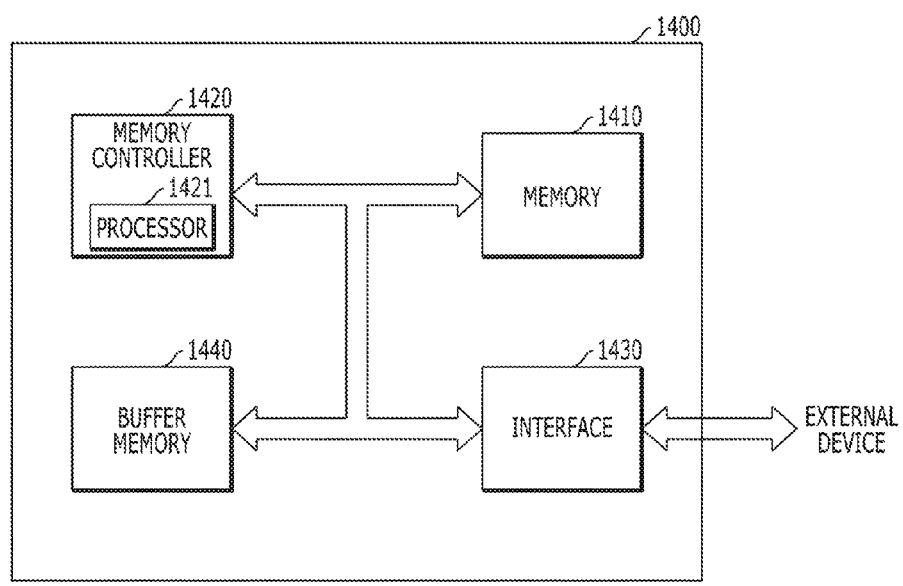
FIG. 8 is an example of configuration diagram of a memory system implementing memory circuitry based on the disclosed technology.

FIG. 8 is an example of configuration diagram of a memory system implementing memory circuitry based on the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a variable resistance element disposed over a substrate and structured to exhibit different resistance states for storing data; and an upper contact plug disposed over the variable resistance element and coupled to the variable resistance element, wherein the upper contact plug includes a first portion that is disposed between an upper end of the upper contact plug and a lower end of the upper contact plug and the first portion has a width smaller than a width of each of the upper end and the lower end. Through this, data storage characteristics and operating characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a variable resistance element disposed over a substrate and structured to exhibit different resistance states for storing data; and an upper contact plug disposed over the variable resistance element and coupled to the variable resistance element, wherein the upper contact plug includes a first portion that is disposed between an upper end of the upper contact plug and a lower end of the upper contact plug and the first portion has a width smaller than a width of each of the upper end and the lower end. Through this, data storage characteristics and operating characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
   a variable resistance element disposed over a substrate and structured to exhibit different resistance states for storing data; and
   an upper contact plug disposed over the variable resistance element and coupled to the variable resistance element,
   wherein the upper contact plug is located between a lower end and an upper end of the upper contact plug that are located at the lowermost portion and the uppermost portion of the upper contact plug, respectively, and includes a first portion that is disposed between the upper end of the upper contact plug and the lower end of the upper contact plug, and wherein the first portion has a width smaller than a width of each of the upper end and the lower end.

2. The electronic device according to claim 1, wherein the upper contact plug has a wine glass-like shape.

3. The electronic device according to claim 1, wherein the upper contact plug includes an upper portion sidewall that is not aligned with a sidewall of the variable resistance element, and a lower portion sidewall that is aligned with the sidewall of the variable resistance element.

4. The electronic device according to claim 3, wherein the upper contact plug includes an upper portion that decreases in width in a direction towards the variable resistance element.

5. The electronic device according to claim 3, wherein the semiconductor memory further comprises a hard mask pattern that is disposed over the lower portion of the upper contact plug and has an inner sidewall surrounding the first portion of the upper contact plug and an outer sidewall aligned with the sidewall of the variable resistance element.

6. The electronic device according to claim 5, wherein the hard mask pattern includes a metal or metal oxide.

7. The electronic device according to claim 5, wherein the variable resistance element comprises a lower portion and an upper portion that is disposed over the lower portion and has a width narrower than that of the lower portion, and
   the semiconductor memory further comprises a protective layer pattern that is disposed on sidewalls of the upper portion of the variable resistance element, sidewalls of the lower portion of the upper contact plug and outer sidewalls of the hard mask pattern.

8. The electronic device according to claim 7, wherein a lower portion of the upper contact plug has sidewalls that are aligned with the upper portion of the variable resistance element.

9. The electronic device according to claim 1, wherein the variable resistance element comprises,
   a Magnetic Tunnel Junction (MTJ) structure including a free layer having a changeable magnetization direction, a pinned layer having a fixed magnetization direction and a tunnel barrier layer interposed between the free layer and the pinned layer, and
   a capping layer disposed over the MTJ structure and including a metal.

10. The electronic device according to claim 9, wherein the upper contact plug comes in direct contact with the capping layer.

11. The electronic device according to claim 9, wherein the variable resistance element further comprises a magnetic correction layer that is disposed between the MTJ structure and the capping layer and offsets or reduces an influence of a stray field generated by the pinned layer.

12. The electronic device according to claim 1, wherein the variable resistance element comprises a lower portion and an upper portion that is disposed over the lower portion and has a width narrower than that of the lower portion, and
the semiconductor memory further comprises a protective layer pattern disposed on a sidewall of the upper portion of the variable resistance element.

13. The electronic device according to claim 12, wherein the upper contact plug has a lower portion having a sidewall aligned with the sidewall of the upper portion of the variable resistance element.

14. The electronic device according to claim 12, wherein the upper contact plug has a lower portion having a sidewall surrounded by the protective layer pattern.

15. The electronic device according to claim 12, wherein the variable resistance element comprises,
a Magnetic Tunnel Junction (MTJ) structure including a free layer having a changeable magnetization direction, a pinned layer having a fixed magnetization direction and a tunnel barrier layer interposed between the free layer and the pinned layer, and
a magnetic correction layer that is disposed over the MTJ structure and offsets or reduces an influence of a stray field generated by the pinned layer,
wherein the upper portion of the variable resistance element comprises a portion of the magnetic correction layer, all of the magnetic correction layer, all of the magnetic correction layer and a portion of the MTJ structure, or all of the magnetic correction layer and all of the MTJ structure.

16. The electronic device of claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

17. The electronic device of claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

18. The electronic device of claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

19. The electronic device of claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

20. The electronic device of claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

* * * * *